US010070536B2

(12) United States Patent
Li et al.

(10) Patent No.: US 10,070,536 B2
(45) Date of Patent: Sep. 4, 2018

(54) MANUFACTURING METHOD OF CIRCUIT BOARD STRUCTURE

(71) Applicant: Unimicron Technology Corp., Taoyuan (TW)

(72) Inventors: Chien-Tsai Li, Hsinchu (TW); Chien-Te Wu, Tainan (TW); Cheng-Chung Lo, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 156 days.

(21) Appl. No.: 15/201,622

(22) Filed: Jul. 5, 2016

(65) Prior Publication Data

US 2018/0014409 A1    Jan. 11, 2018

(51) Int. Cl.
| *H01K 3/10* | (2006.01) |
| *H05K 3/40* | (2006.01) |
| *H05K 3/46* | (2006.01) |
| *H05K 3/22* | (2006.01) |

(52) U.S. Cl.
CPC ............ *H05K 3/4038* (2013.01); *H05K 3/22* (2013.01); *H05K 3/4644* (2013.01)

(58) Field of Classification Search
CPC ........... H01L 23/49838; H01L 21/4857; H01L 21/486; H01L 23/49822; H01L 23/49827; H01L 21/6833; H01L 21/4853; H05K 1/0306; H05K 3/0029; H05K 1/115; H05K 3/1275; H05K 3/0023; H05K 3/002;

(Continued)

(56) References Cited

U.S. PATENT DOCUMENTS 5,644,107 A * 7/1997 Kubota ................. H01G 2/065
                                                    174/262
6,120,661 A * 9/2000 Hirano .................... C03C 15/00
                                                    118/723 R (Continued)

FOREIGN PATENT DOCUMENTS

CN         1638094           7/2005
JP      2000133948 A  *  5/2000

(Continued)

OTHER PUBLICATIONS

"Office Action of Taiwan Counterpart Application," dated Oct. 16, 2017, p. 1-p. 8.

*Primary Examiner* — Paul D Kim
(74) *Attorney, Agent, or Firm* — JCIPRNET

(57) ABSTRACT

Provided is a manufacturing method of a circuit board structure including steps as below. A glass film is provided on an electrostatic chuck (E-chuck). A dicing process is performed, such that at least one slit is formed in the glass film. A plurality of first conductive vias are formed in the glass film. A first circuit layer is formed on the glass film. A polymer layer is formed on the first circuit layer. The polymer layer covers surfaces of the first circuit layer and the glass film. A plurality of second conductive vias are formed in the polymer layer. A second circuit layer is formed on the polymer layer, such that a first circuit board structure is formed. A singulation process is performed, such that the first circuit board structure is divided into a plurality of second circuit board structures.

7 Claims, 4 Drawing Sheets

(58) Field of Classification Search
CPC ...... H05K 3/22; H05K 3/4007; H05K 3/4038; H05K 3/4644
See application file for complete search history.

(56) References Cited

U.S. PATENT DOCUMENTS

| | | | | |
|---|---|---|---|---|
| 6,350,957 | B1* | 2/2002 | Shingai | H01L 21/4853 174/254 |
| 6,479,374 | B1* | 11/2002 | Ioka | H01L 21/02126 257/E21.273 |
| 6,748,652 | B2* | 6/2004 | Andou | H05K 3/20 29/830 |
| 7,134,195 | B2* | 11/2006 | Sunohara | H01L 21/6835 29/832 |
| 7,615,130 | B2* | 11/2009 | Shelnut | G02B 6/138 156/247 |
| 8,240,035 | B2* | 8/2012 | Nishikawa | H01L 21/561 29/412 |
| 8,341,814 | B2* | 1/2013 | Yoshimatsu | H03H 3/02 156/307.1 |
| 8,530,752 | B2* | 9/2013 | Kawabata | H01L 23/49822 174/260 |
| 8,907,489 | B2* | 12/2014 | Kunimoto | H01L 23/49827 257/774 |
| 2004/0244191 | A1* | 12/2004 | Orr | H05K 3/4092 29/842 |
| 2010/0015759 | A1* | 1/2010 | Takano | H01L 21/565 438/109 |
| 2014/0205816 | A1* | 7/2014 | Maejima | H01L 21/6836 428/200 |
| 2018/0005933 | A1* | 1/2018 | Wu | H01L 23/49838 |

FOREIGN PATENT DOCUMENTS

| | | | |
|---|---|---|---|
| JP | 2003338668 | A * | 11/2003 |
| TW | 373198 | | 11/1999 |
| TW | 200616062 | | 5/2006 |
| TW | 200736179 | | 10/2007 |
| TW | 200833623 | | 8/2008 |
| TW | M467665 | | 12/2013 |
| TW | 201539678 | | 10/2015 |

* cited by examiner

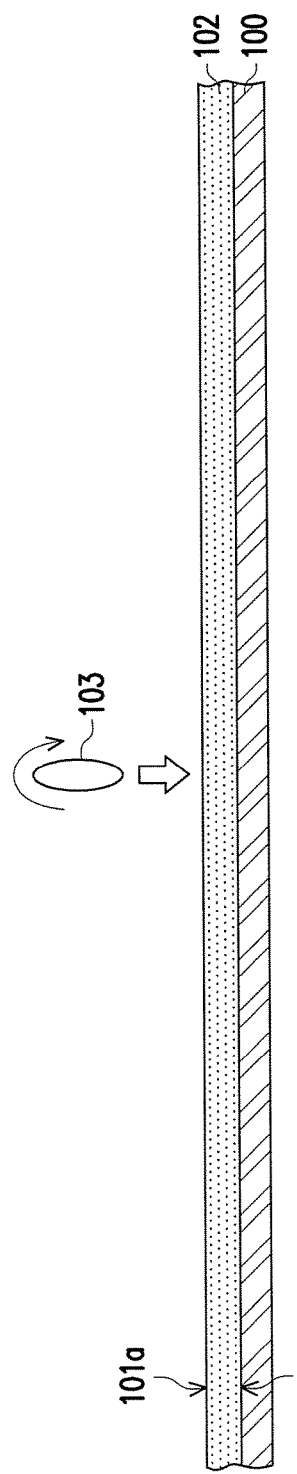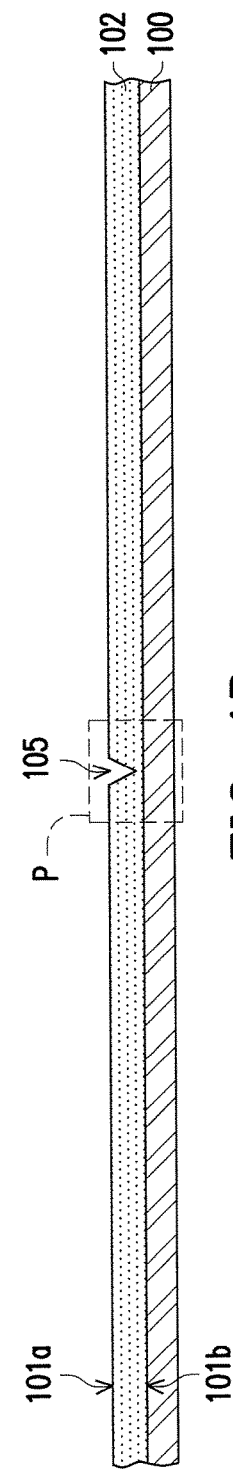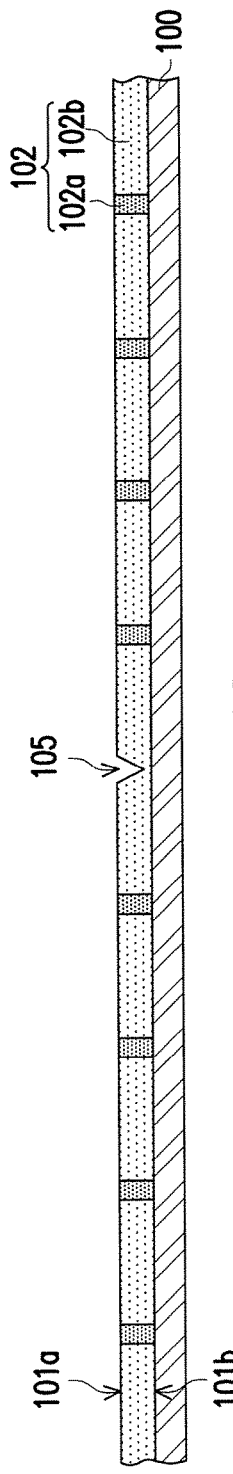

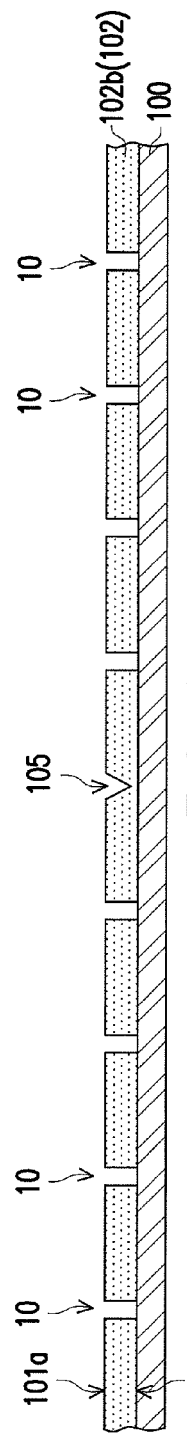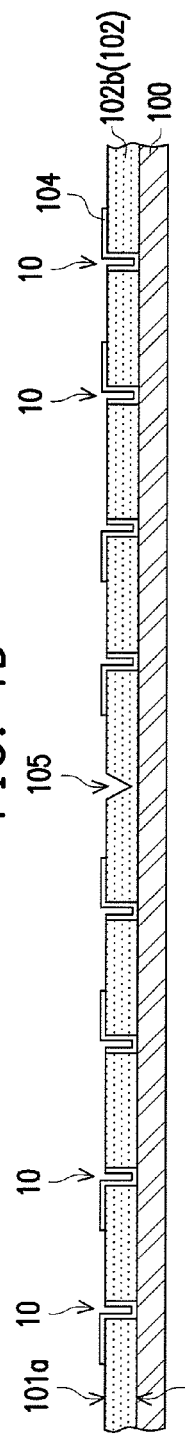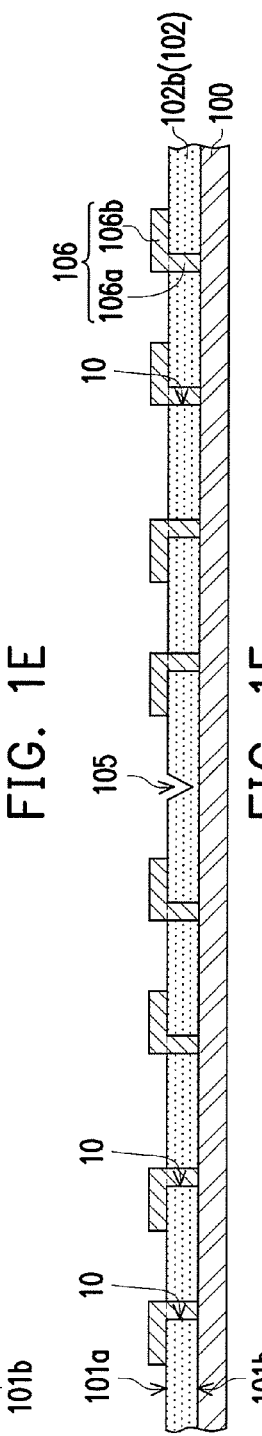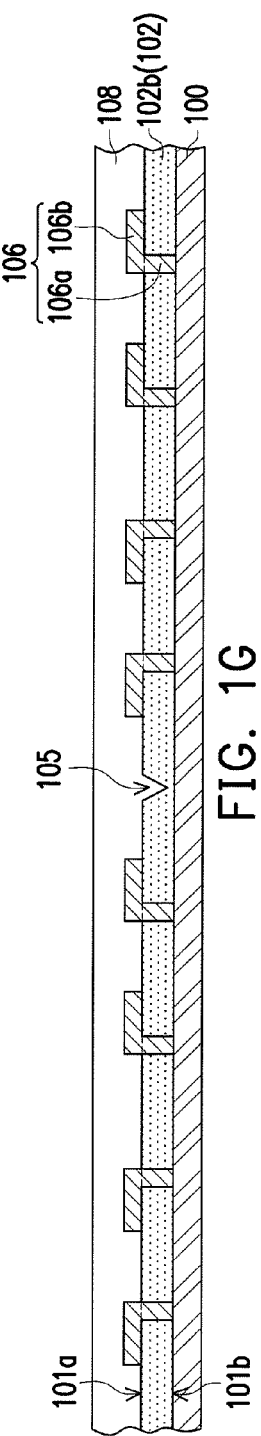

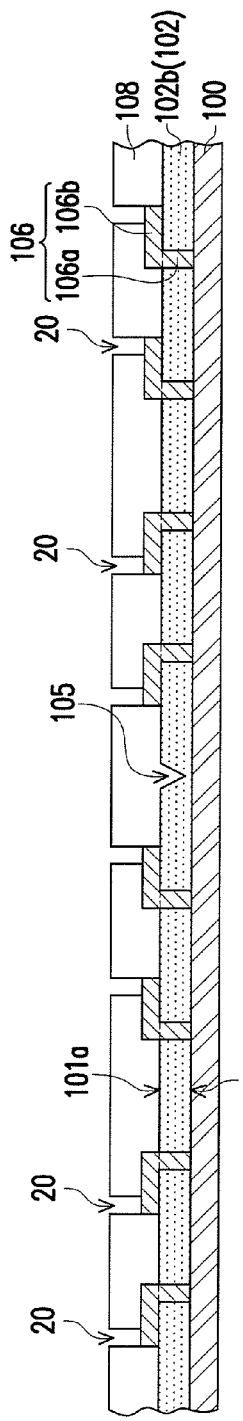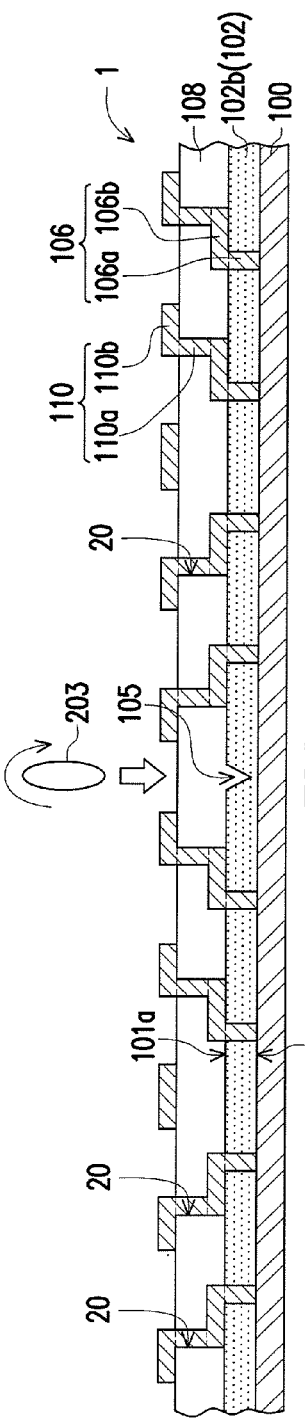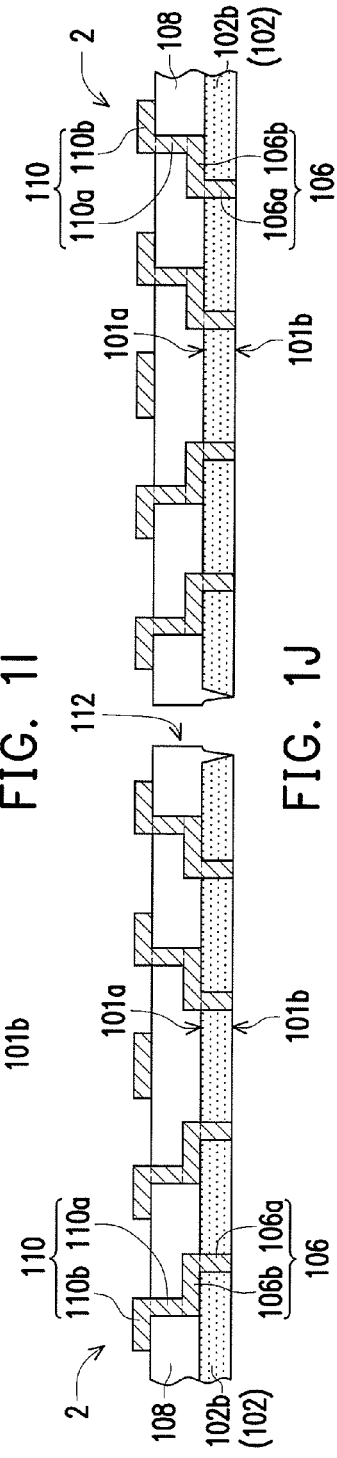

US 10,070,536 B2

MANUFACTURING METHOD OF CIRCUIT BOARD STRUCTURE

BACKGROUND OF THE INVENTION

Field of the Invention

The invention relates to a manufacturing method of a semiconductor structure, and particularly relates to a manufacturing method of a circuit board structure.

Description of Related Art

Since the requirements for portability and multi-function of consumer electronics products are increased, a semiconductor device is moving towards a trend of small size, high performance, and low cost. In this trend, the semiconductor device is required to add more input/output (I/O) pads onto a circuit board in a smaller area. In other words, with a higher integrity of the semiconductor device, the requirements for reliability and yield of semiconductor packaging technology is higher.

In general, after completing a packaging process of a redistribution layer, the whole board is required to dice into a plurality of smaller boards. A laser method is used to dice in the current dicing method mostly, so as to reduce the problem of stress residual. However, the rate of dicing by the laser method is slower, which is not conducive to productivity and manufacturing cost.

SUMMARY OF THE INVENTION

The invention provides a manufacturing method of a circuit board structure including a second dicing, which can reduce dicing residual stress and increase productivity simultaneously.

The invention provides a manufacturing method of a circuit board structure including the following steps. A glass film having an upper surface and a lower surface is provided, and the lower surface of the glass film is disposed on an electrostatic chuck (E-chuck). A dicing process is performed, such that at least one slit is formed in the upper surface of the glass film. A plurality of first conductive vias are formed in the upper surface of the glass film. A first circuit layer is formed on the upper surface of the glass film, such that the first circuit layer is electrically connected with the first conductive vias. A polymer layer is formed on the first circuit layer. The polymer layer covers surfaces of the first circuit layer and the glass film. A plurality of second conductive vias are formed in the polymer layer. The second conductive vias are electrically connected with the first circuit layer. A second circuit layer is formed on the polymer layer, such that the second circuit layer is electrically connected with the second conductive vias, so as to form a first circuit board structure. A singulation process is performed, such that the first circuit board structure is divided into a plurality of second circuit board structures.

According to an embodiment of the invention, a surface of the electrostatic chuck is not exposed by the slit.

According to an embodiment of the invention, a depth of the slit is at least more than two-thirds of a thickness of the glass film.

According to an embodiment of the invention, an angle between a sidewall of the slit and a bottom surface of the glass film is between 30 degrees and 60 degrees.

According to an embodiment of the invention, a number of the slit is multiple. The slits include a plurality of first scribing lines parallel to a first direction and a plurality of second scribing lines parallel to a second direction. The first direction is intersected with the second direction.

According to an embodiment of the invention, when the polymer layer is formed on the first circuit layer, the polymer layer is filled in the slit.

According to an embodiment of the invention, the step of dicing process includes performing dicing on the glass film by a diamond tool.

According to an embodiment of the invention, before the singulation process is performed, the manufacturing method further includes using an alignment mark, such that a diamond tool is aligned with a position of the slit.

According to an embodiment of the invention, after the singulation process is performed, the manufacturing method further includes removing the electrostatic chuck.

Based on the above, by forming the slit in the glass film, the invention provides a stress concentration region at the slit. Then, a redistribution layer structure is formed on the glass film. Thereafter, the second dicing is performed along a direction of the slit by the diamond tool, such that the stress is released from the position of the slit. Therefore, the dicing residual stress at an edge of the redistribution layer structure resulted in an irregular rupture of the glass film can be avoided in the invention. In other words, by the second dicing, the dicing edge of the circuit board structure is more flat in the invention. Additionally, compared with the conventional laser dicing, the invention not only can reduce the dicing residual stress, but also can increase productivity simultaneously.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1J are schematic cross-sectional diagrams of a manufacturing process of a circuit board structure according to an embodiment of the invention.

DESCRIPTION OF THE EMBODIMENTS

Figure 2:
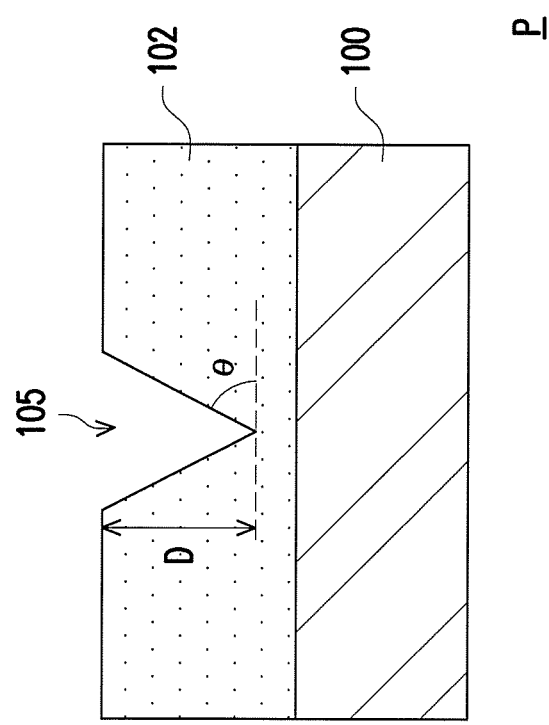
FIG. 2 is an enlarged schematic cross-sectional diagram of a part of FIG. 1B.

The invention is illustrated more comprehensively referring to the drawings of the embodiments. However, the invention may be embodied in many different forms and should not be construed as limited to the embodiments set forth herein. Thicknesses of layers and regions in the drawings may be enlarged for clarity. The same or similar reference numbers represent the same or similar components, and are not repeated again in the following paragraphs.

FIG. 1A to FIG. 1J are schematic cross-sectional diagrams of a manufacturing process of a circuit board structure according to an embodiment of the invention. FIG. 2 is an enlarged schematic cross-sectional diagram of a part of FIG. 1B.

Referring to FIG. 1A and FIG. 1B, a glass film 102 is provided on an electrostatic chuck 100, wherein the glass film 102 has an upper surface 101a and a lower surface 101b opposite to each other. In particular, the electrostatic chuck 100 can absorb the lower surface 101b of the glass film 102 by electrostatic force, such that the glass film 102 is held on the electrostatic chuck 100 without warping. In an embodiment, a thickness of the glass film 102 may be between 5 micrometers and 100 micrometers, for example. Preferably, the thickness of the glass film may be 10 micrometers, 20 micrometers, 30 micrometers, 50 micrometers, or 80 micrometers, for example. A size of the glass film 102 may be adjusted according to the needs of a user.

Then, a dicing process is performed on the glass film 102 by a diamond tool 103, so as to form a slit 105 (as shown in FIG. 1B) in the glass film 102. Specifically, as shown in enlarged FIG. 2 of a part P of FIG. 1B, the slit 105 is in the shape of an inverted triangle, and a surface of the electrostatic chuck 100 is not exposed. A depth D of the slit 105 is at least more than two-thirds of a thickness of the glass film 102, but the slit 105 does not penetrate the glass film 102. In an embodiment, the depth D of the slit 105 may be between 4 micrometers and 67 micrometers. An angle θ between a sidewall of the slit 105 and a bottom surface of the glass film 102 may be between 30 degrees and 60 degrees.

On the other hand, from a top view, a number of the slit 105 may be multiple, for example. In particular, the slits 105 include a plurality of first scribing lines parallel to a first direction and a plurality of second scribing lines parallel to a second direction. The first direction is intersected with the second direction. That is, the glass film 102 having an entire surface can be pre-diced to the glass film having a plurality of small boards (i.e., the glass films at two sides of the slit 105 in FIG. 1B) by the dicing process of the embodiment, so as to facilitate performing the subsequent singulation process. In an embodiment, the first direction and the second direction are perpendicular to each other substantially.

Referring to FIG. 1C, a laser light is irradiated to the glass film 102, so as to form a plurality of modified regions 102a in the glass film 102. The regions outside of the modified regions 102a are non-modified regions 102b. In an embodiment, the laser light may be a carbon dioxide ($CO_2$) laser, for example. A wavelength of the laser light may be between 9 micrometers and 11 micrometers. An energy of the laser light may be between 200 mW and 10 mW. Preferably, the laser energy may be 150 mW, 100 mW, 70 mW, 50 mW, 30 mW, or 20 mW, for example. The irradiation time of the laser light may be between 50 minutes and 10 minutes. Preferably, the laser irradiation time may be 40 minutes, 30 minutes, or 20 minutes, for example.

Referring to FIG. 1C and FIG. 1D, an etching process is performed to remove the glass film 102 in the modified regions 102a. A plurality of first via holes 10 are formed in the glass film 102. The first via holes 10 penetrate the upper surface 101a and the lower surface 101b of the glass film 102. As shown in FIG. 1D, the first via holes 10 and the slit 105 are not intersected and overlapped. In particular, since an etching rate of the etching process on the modified regions 102a is more than an etching rate of the etching process on the non-modified regions 102b, the glass film 102 in the modified regions 102a can be completely removed, so as to expose the surface of the electrostatic chuck 100. However, the invention is not limited to. In other embodiments, a plurality of blind via holes (not shown) may be formed in the glass film 102, and the surface of the electrostatic chuck 100 is not exposed. In an embodiment, the etching process includes a wet etching process. The etchant used in the wet etching process may be hydrofluoric acid (HF), diluted hydrofluoric acid (DHF), or a buffered oxide etchant (BOE), for example. In an embodiment, an etching selectivity of the modified region 102a to the non-modified region 102b may be between 20:1 and 100:1. However, the invention is not limited to.

Referring to FIG. 1D and FIG. 1E, a seed layer 104 is formed on a portion of the upper surface 101a of the glass film 102 and on a surface of the first via holes 10. Specifically, a seed material layer (not shown) is formed on the glass film 102 first. The seed material layer conformally covers the upper surface 101a of the glass film 102 and the surface of the first via holes 10. Then, a lithography process and an etching process are performed to remove a portion of the seed material layer, so as to form the seed layer 104. In an embodiment, a material of the seed layer 104 includes a metal material, metal nitride, metal silicide, or a combination thereof. The metal material may be titanium, copper, nickel, palladium, gold, silver, or a combination thereof, for example. A forming method of the seed layer 104 includes physical vapor deposition, chemical vapor deposition, an electroplating process, or an electroless plating process. The physical vapor deposition may be sputtering deposition or vapor deposition, for example.

Referring to FIG. 1E and FIG. 1F, an electroplating process or an electroless plating process is performed, so as to form a conductive structure 106 on a surface of the seed layer 104. Specifically, the conductive structure 106 includes a first conductive via 106a filled in the first via hole 10 and a first circuit layer 106b disposed on the upper surface 101a of the glass film 102. The first conductive via hole 106a is electrically connected with the first circuit layer 106b. In an embodiment, a material of the conductive structure 106 includes a metal material. The metal material may be titanium, copper, nickel, palladium, gold, silver, or a combination thereof, for example. Incidentally, the seed layer 104 may be regarded as a part of the conductive structure 106. Thus, the seed layer 104 is not shown in FIG. 1F.

Referring to FIG. 1G, a polymer layer 108 is formed on the first circuit layer 106b. The polymer layer 108 not only covers a surface of the first circuit layer 106b and the upper surface 101a of the glass film 102, but also is filled in the slit 105. In an embodiment, a material of the polymer layer 108 includes a photosensitive material. The photosensitive material may be a chemically amplified photosensitive material, for example. In an embodiment, a coefficient of thermal expansion (CTE) of the chemically amplified photosensitive material may be between 45 ppm/° C. and 55 ppm/° C. A thickness of the polymer layer 108 may be between 5 micrometers and 20 micrometers, and a forming method thereof may be spray coating.

Referring to FIG. 1G and FIG. 1H, a patterned mask layer (not shown) is formed on the polymer layer 108. Thereafter, the patterned mask layer is used as a mask to perform a lithography process, so as to form a plurality of second via holes 20 in the polymer layer 108. A portion of the surface of the first circuit layer 106b is exposed by the second via holes 20. It should be mentioned that, since the chemically amplified photosensitive material is used as the polymer layer 108 in the embodiment, an exposure energy of the lithography process may be less than 250 mJ during the lithography process. Also, exposure time can be shortened. Therefore, the process time can be reduced to increase the yield in the embodiment.

Referring to FIG. 1H and FIG. 1I, a seed layer (not shown) is formed on a surface of the polymer layer 108 and a surface of the second via hole 20, and an electroplating process or an electroless plating process is performed, so as to form a conductive structure 110 on a surface of the seed layer (not shown). A material and a forming method of the conductive structure 110 is similar to the material and the foil ling method of the conductive structure 106 in FIG. 1F, and is not described in detail here. Similarly, the conductive structure 110 includes a second conductive via 110a filled in the second via hole 20 and a second circuit layer 110b disposed on the polymer layer 108. The second circuit layer 110b may be electrically connected with the conductive structure 106 by the second conductive via 110a. At this time, the glass film 102, the conductive structures 106 and 110 and the polymer layer 108 may be regarded as a first circuit board structure 1.

Referring to FIG. 1I and FIG. 1J, by using an alignment mark (not shown) on the glass film 102, a diamond tool 203 is aligned with the position of the slit 105. Then, a singulation process is performed on the first circuit board structure 1. Specifically, the diamond tool 203 may dice along the direction of the slit 105, such that the first circuit board structure 1 is divided into a plurality of second circuit board structures 2. Thereafter, the electrostatic chuck 100 is removed, so as to expose the lower surface 101b of the glass film 102 and the surface of the first conductive via 106a. However, the invention is not limited to. In other embodiments, the electrostatic chuck 100 may be removed first, and then the singulation process is performed on the first circuit board structure 1.

It should be mentioned that, since the slit 105 is in the shape of an inverted triangle, and the region of the lower sharp corner near the electrostatic chuck 100 is a stress concentration region, the dicing stress is released from the position of the slit 105 when the diamond tool 203 dices along the direction of the slit 105, thereby dividing the glass film 102. Thus, an edge 112 of the second circuit board structure 2 is more flat, and the second circuit board structure 2 is not damaged.

Additionally, the thinner glass film 102 is absorbed and held on the electrostatic chuck 100 in the embodiment, such that the problem of flexibility is not produced when the conductive structure 106, the polymer layer 108, and the conductive structure 110 are formed on the glass film 102 subsequently. Thereafter, the step of removing the electrostatic chuck 100 does not produce the warping phenomenon caused by the problem of stress in a prior art. Therefore, the problems of flexibility and warping can be avoided in the manufacturing method of the circuit board structure of the embodiment, thereby improving the reliability and yield of the product. Additionally, the polymer material is used as a dielectric layer of the circuit board in the embodiment, and the polymer material has a lower coefficient of thermal expansion and a less amount of out gas. Thus, the dimensional stability of the circuit board of the embodiment is better, which is hardly affected by an ambient temperature, thereby improving the reliability.

Although only the conductive vias 106a and 110a, one layer of the polymer layer 108 and two layers of the circuit layers 106b and 110b are shown in the second circuit board structure 2 of FIG. 1J, the invention is not limited to. In other embodiments, numbers and connection methods of the conductive via, the polymer layer and the circuit layer may be adjusted according to the needs of a designer.

In summary, by forming the slit in the glass film, the invention provides the stress concentration region at the slit. Then, the redistribution layer structure is formed on the glass film. Thereafter, the second dicing is performed along the direction of the slit by the diamond tool, such that the stress is released from the position of the slit. Therefore, the dicing residual stress at the edge of the redistribution layer structure resulted in the irregular rupture of the glass film can be avoided in the invention. In other words, by the second dicing, the dicing edge of the circuit board structure is more flat in the invention. Additionally, compared with the conventional laser dicing, the invention not only can reduce the dicing residual stress, but also can increase productivity simultaneously.

Additionally, the thinner glass film is absorbed and held on the electrostatic chuck in the invention, such that the problem of flexibility is not produced when the conductive structure and the polymer layer are formed on the glass film subsequently. Thereafter, the step of removing the electrostatic chuck does not produce the warping phenomenon caused by the problem of stress in a prior art. Therefore, the problem of warping of the redistribution layer structure caused by the stress generated from de-bonding can be avoided in the invention, thereby improving the reliability and yield of the product.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a circuit board structure, comprising:
    providing a glass film having an upper surface and a lower surface, and the lower surface of the glass film being disposed on an electrostatic chuck;
    performing a dicing process, such that at least one slit is formed in the upper surface of the glass film, wherein a surface of the electrostatic chuck is not exposed by the slit and a depth of the slit is at least more than two-thirds of a thickness of the glass film;
    forming a plurality of first conductive vias in the upper surface of the glass film;
    forming a first circuit layer on the upper surface of the glass film, such that the first circuit layer is electrically connected with the first conductive vias;
    forming a polymer layer on the first circuit layer, and the polymer layer covering surfaces of the first circuit layer and the glass film;
    forming a plurality of second conductive vias in the polymer layer, wherein the second conductive vias are electrically connected with the first circuit layer;
    forming a second circuit layer on the polymer layer, such that the second circuit layer is electrically connected with the second conductive vias, so as to form a first circuit board structure; and
    performing a singulation process, such that the first circuit board structure is divided into a plurality of second circuit board structures.

2. The manufacturing method of the circuit board structure according to claim 1, wherein an angle between a sidewall of the slit and a bottom surface of the glass film is between 30 degrees and 60 degrees.

3. The manufacturing method of the circuit board structure according to claim 1, wherein a number of the slit is multiple, the slits comprising a plurality of first scribing lines parallel to a first direction and a plurality of second scribing lines parallel to a second direction, and the first direction is intersected with the second direction.

4. The manufacturing method of the circuit board structure according to claim 1, wherein the polymer layer is filled in the slit when the polymer layer is formed on the first circuit layer.

5. The manufacturing method of the circuit board structure according to claim 1, wherein the step of dicing process comprises performing dicing on the glass film by a diamond tool.

6. The manufacturing method of the circuit board structure according to claim 1, before performing the singulation process, further comprising using an alignment mark, such that a diamond tool is aligned with a position of the slit.

7. The manufacturing method of the circuit board structure according to claim 1, after performing the singulation process, further comprising removing the electrostatic chuck.

\* \* \* \* \*